United States Patent [19]
Choi et al.

[11] Patent Number: 5,483,483
[45] Date of Patent: Jan. 9, 1996

[54] READ-ONLY MEMORY DEVICE

[75] Inventors: Jung-dal Choi, Suwon; Kang-deok Suh, Anyang, both of Rep. of Korea

[73] Assignee: Samsung Electronics Co., Ltd., Suwon, Rep. of Korea

[21] Appl. No.: 206,824

[22] Filed: Mar. 7, 1994

[30] Foreign Application Priority Data

Mar. 5, 1993 [KR] Rep. of Korea .................... 93-3299

[51] Int. Cl.$^6$ .................................. G11C 11/34
[52] U.S. Cl. .................. 365/177; 365/184; 257/378; 257/382; 257/390
[58] Field of Search ........................ 365/177, 184; 257/378, 390, 382

[56] References Cited

U.S. PATENT DOCUMENTS

| | | | |
|---|---|---|---|
| 4,648,074 | 3/1987 | Pollachek | 365/184 |
| 4,868,628 | 9/1989 | Simmons | 365/177 |
| 5,101,257 | 3/1992 | Hayden et al. | 257/378 |
| 5,101,262 | 3/1992 | Ariizumi et al. | 257/390 |
| 5,363,325 | 11/1994 | Sunouchi et al. | 365/177 |

*Primary Examiner*—Robert P. Limanek
*Attorney, Agent, or Firm*—Cushman Darby & Cushman

[57] ABSTRACT

A semiconductor memory device includes a current driving transistor composed of a bipolar transistor which is coupled to a corresponding bit line for increasing the bit line current. The collector of the current driving transistor is constituted by a well coupled to ground and the base is constituted by a common drain region of two adjacent string selecting transistors. The emitter of the current driving transistor is a separate polysilicon layer disposed from among a first interlayer insulating layer and a second interlayer insulating layer and the emitter is coupled to both the base region and the bit line through contact holes. Otherwise, the emitter of the current driving transistor is a doping region formed in the base region which serves as the common drains of two adjacent string selecting transistor.

The memory device has the effect that the operation speed is increased and the integration density can be increased, so as to reduce the cost thereof.

13 Claims, 13 Drawing Sheets

READ-ONLY MEMORY DEVICE

BACKGROUND OF THE INVENTION

The present invention relates to a semiconductor memory device, and more particularly to a semiconductor memory device which can be operated at high speed by the increase of the current in a bit line.

Common semiconductor memory devices include a RAM(Random Access Memory) which can perform both a writing operation and a reading operation, and a ROM(Read Only Memory) which can perform only a reading operation. A RAM may be a DRAM(dynamic RAM) or a SRAM(static RAM), while a ROM may be a mask ROM or a programmable ROM.

A memory device includes a plurality of memory cells arranged in a matrix, where each memory cell corresponds to at least one word line and at least one bit line. A word line is applied with a signal which controls the access to the corresponding cells. If the word line is active, access should be allowed to the corresponding cells, otherwise, it shouldn't be allowed. Data is transferred to or from a memory cell through a bit line.

The detection of data in a memory device usually employs NAND logic circuitry or NOR logic circuitry. A power supply node is coupled to the bit line through a load and the other end of the bit line is coupled to a sense amplifier. In a memory device employing NAND circuitry, a plurality of memory cells constitutes a string and a plurality of strings may be coupled to one bit line in order to increase the density of integration. As the number of strings coupled to one bit line increases, both the stray capacitance of the bit line and the junction capacitance which exists between the bit line and the string are increased. This results in increased total bit line capacitance which reduces bit line current and operation speed.

SUMMARY OF THE INVENTION

Accordingly, an object of the present invention is to provide a semiconductor device which can be operated at high speed.

To attain the above and other objects, a semiconductor memory device according to one aspect of the present invention comprises:

a plurality of word lines;

a plurality of bit lines:

a plurality of current driving transistors each having an emitter, a collector and a base wherein the emitter is coupled to a corresponding bit line, and the collector is coupled to ground; and a plurality of strings each composed of multiple memory elements coupled in series between the base of a corresponding current driving transistor and ground, wherein each memory element is composed of one selected from among a first memory element and a second memory element in accordance with a predetermined program, with the first memory element being "ON" irrespective of a corresponding word line signal and the second memory element being switchable "ON" and "OFF" in accordance with a corresponding word line signal.

In one embodiment, the first memory element is composed of a depletion mode MOS transistor and the second memory element is composed of an enhancement mode MOS transistor. In addition, there is provided a string selecting line through which a string selecting signal is transferred; and a plurality of string selecting transistors each being coupled in series between the base of a corresponding current driving transistor and one end of a corresponding string and having the gate coupled to the string selecting line.

To attain the above and other objects, a semiconductor memory device according to a second aspect of the present invention, comprises:

a plurality of word lines;

a plurality of bit lines;

a plurality of strings each composed of multiple memory elements coupled in series and each string having one end coupled to ground, wherein each memory element is composed of one selected from among a first memory element and a second memory element in accordance with a predetermined program, with the first memory element being "ON" irrespective of a corresponding word line signal and the second memory element being switchable "ON" and "OFF" in accordance with a corresponding word line signal;

a plurality of string selecting lines for receiving a corresponding string selecting signal:

a plurality of string selecting transistors each having a source, a drain and a gate, with the source being coupled to the other end of a corresponding string and the gate being coupled to a corresponding string selecting line; and a plurality of current driving transistors each having a collector, an emitter and a base, with the base being coupled to the drains of two adjacent string selecting transistors, and an emitter coupled to a corresponding bit line.

In one embodiment, the first memory element is composed of a depletion mode MOS transistor and the second memory element is composed of an enhancement mode MOS transistor.

To attain the above and other objects, a semiconductor SRAM cell circuit according to the third aspect of the present invention comprises:

a bit line;

an inverse bit line;

a word line;

a first current driving transistor having an emitter, a collector and a base, with the emitter being coupled to the bit line;

a second current driving transistor having an emitter, a collector and a base, with the emitter being coupled to the inverse bit line;

a data latch element having a first node and a second node, for storing data as a potential difference between the first node and the second node;

a first access transistor coupled between the base of the first current driving transistor and the first node of the data latch element, and being switched between ON/OFF in accordance with the signal of the word line; and a second access transistor coupled between the base of the second current driving transistor and the second node of the data latch element, and being switched between ON/OFF in accordance with the signal of the word line.

To attain the above and other objects, a semiconductor memory structure according to a fourth aspect of the present invention comprises:

a semiconductor substrate;

a plurality of word lines formed over the semiconductor substrate with a first insulating layer disposed therebetween;

a plurality of bit lines formed over the first insulating layer with a second insulating layer disposed therebetween;

a plurality of strings formed over the semiconductor substrate, each composed of multiple memory elements coupled in series and having one end coupled to ground, wherein each memory element is composed of one selected from among a first memory element and a second memory element in accordance with a predetermined program with the first memory element being "ON" irrespective of a corresponding word line signal and the second memory element being switchable "ON" and "OFF" in accordance with a corresponding word line signal;

a plurality of string selecting transistors, each having a source coupled to the other end of a corresponding string, a gate line applied for receiving a corresponding string selecting signal and a common drain region, wherein the common drain region serves as the drain of two adjacent string selecting transistors; and a plurality of current driving transistors, each having a collector composed of a well, a base constituted by the common drain region which is disposed over the well, and an emitter constituted by a semiconductor layer formed between the first insulating layer and the second insulating layer and coupled to the common drain region through a contact hole in the first insulating layer and coupled to a corresponding bit line through a contact hole in the second insulating layer.

In one embodiment, the common drain region which also serves as the base of the current driving transistor is doped with N-type impurities in a concentration of $10^{17}$~$10^{19}$ dopants/cm$^2$. The semiconductor layer serving as the emitter of the current driving transistor is a polysilicon layer having a thickness of 500 Å~1500 Å. The well serving as the collector of the current driving transistor is doped with impurities in a concentration of $10^{14}$~$10^{16}$ dopants/cm$^2$.

To attain the above and other objects, a semiconductor memory structure according to a fifth aspect of the present invention comprises:

a semiconductor substrate;

a plurality of word lines formed over the semiconductor substrate with a first insulating layer disposed therebetween;

a plurality of bit lines formed over the semiconductor substrate with a second insulating layer disposed therebetween;

a plurality of strings formed over the semiconductor substrate, each string being composed of multiple memory elements and having one end coupled to ground, where each memory element is one selected from among a first memory element and a second memory element in accordance with a predetermined program, with the first memory element being "ON" irrespective of the signal of a corresponding word line and the second memory element being switchable between "ON" and "OFF" in accordance with a corresponding word line signal;

a plurality of string selecting transistors, each having a source coupled to the other end of a corresponding string, a gate line for receiving a corresponding string selecting signal and a common drain region, wherein the common drain region serves as the drain of two adjacent string selecting transistors; and a plurality of current driving transistors, each having a collector composed of a well, a base constituted by the common drain region which is disposed over the well, and an emitter constituted by a doping region formed in the common drain region and coupled to a corresponding bit line through a contact hole in the second insulating layer.

In one embodiment, the common drain region which also serves as the base of the current driving transistor is doped with a N-type impurities in a concentration of $10^{17}$~$10^{19}$ dopants/cm$^2$ and has a depth of 0.1 μm~0.5 μm. The well serving as the collector of the current driving transistor is doped with impurities in a concentration of $10^{14}$~$10^{16}$ dopants/cm$^2$.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

The semiconductor memory device according to the present invention includes a bipolar transistor having an emitter coupled to a bit line and a collector coupled to ground, which improves the current driving capability and thereby increases the operation speed.

Figure 1:
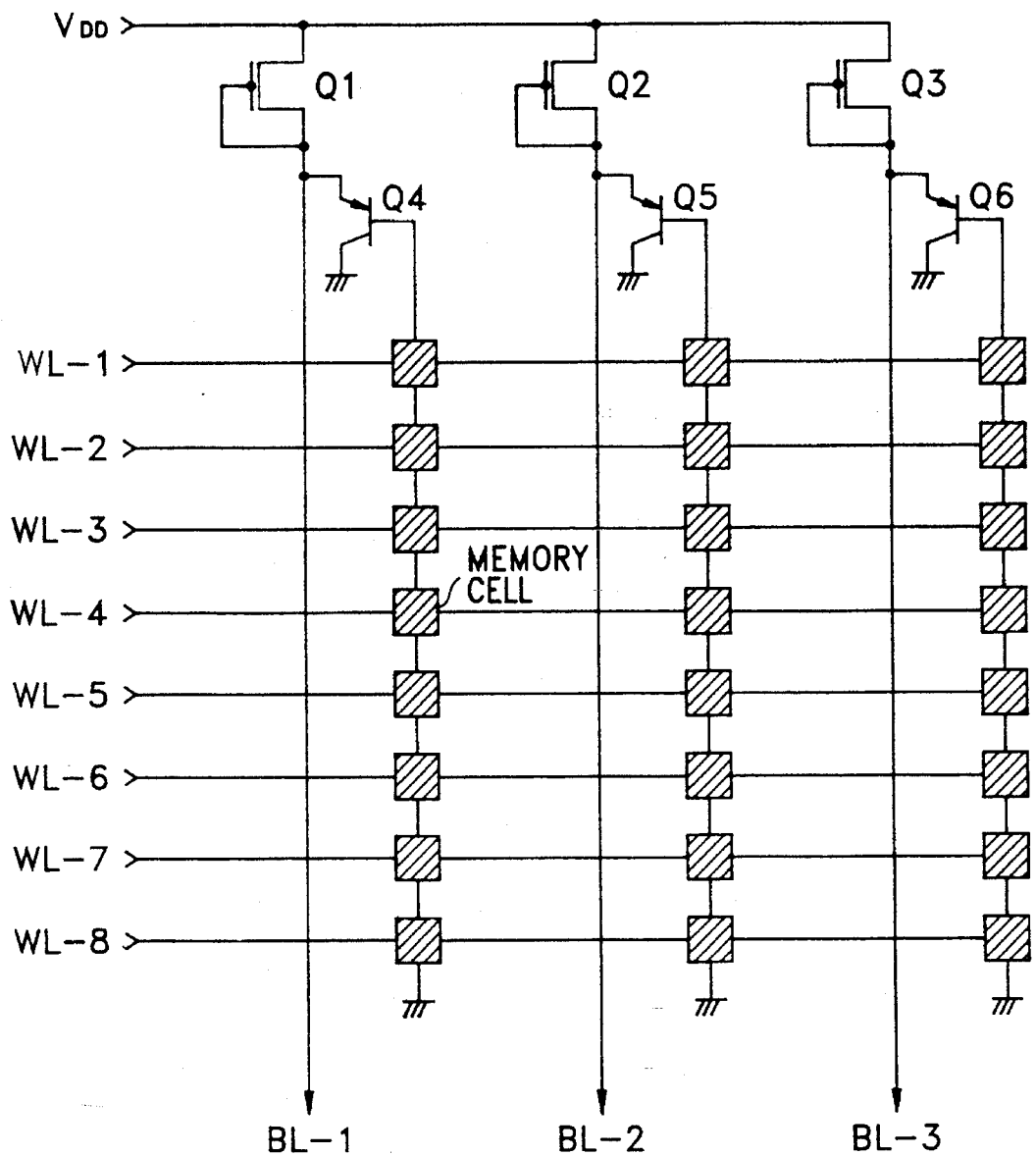
FIG. 1 illustrates one embodiment of a semiconductor ROM device according to the present invention.

FIG. 1 is a schematic circuit diagram of a semiconductor ROM device according to one embodiment of the present invention, and in particular represents a portion of a cell array structure of a NAND ROM.

Common ROM types include a NOR ROM using NOR logic circuitry and a NAND ROM using NAND logic circuitry. In a NOR ROM, each memory cell is coupled between a bit line and ground, which provides the advantage that the operation speed is high. However, this requires that a contact hole should be formed for each cell, resulting in an inefficient use of chip area and increased manufacturing cost. On the other hand, a NAND ROM has the advantage that the chip area is efficiently used but has the disadvantage that the current driving capability is low, resulting in low operation speed. The employment of a current driving transistor according to the present invention is efficient for a NAND ROM, because the current driving transistor improves the current driving capability in the memory cell.

Referring to FIG. 1, a plurality of word lines WL-1 through WL-8 and a plurality of bit lines BL-1 through BL-8 are shown. Each bit line is coupled to the power supply node $V_{DD}$ via a load Q1, Q2, or Q3, to transfer the data stored in one of the memory cells included in the corresponding string. A plurality of memory cells which constitute one string are coupled in series between the base of a current driving transistor and ground. One string is usually comprised of 8 or 16 memory cells. (In FIG. 1, one string is comprised of 8 memory cells.) Memory cells are arranged in a matrix with a word line column and each memory cell is made of one selected from among a first memory element and a second memory element in accordance with a predetermined program. The first memory element is always "ON" irrespective of the signal of the word line (ROM), while the second memory element is switched ON/OFF in accordance with the signal of the corresponding word line (RAM).

The current driving transistors Q4, Q5 and Q6 are constituted by bipolar transistors each having an emitter coupled to the corresponding bit line, a collector coupled to ground, and a base coupled to the first memory cell of the corresponding string. Preferably, the current driving transistors are constituted by vertical bipolar transistors.

The operation of a ROM having such a structure is as follows. A selected word line is supplied with an activate signal, and the data according to the program state of the memory cells corresponding with the selected word line is detected through the bit lines. In other words, in the selected word line, where the memory cell is the first memory element the corresponding bit line has a first state, and where the memory cell is the second memory element the corresponding bit line has a second state.

Known methods for programming the memory cells in a ROM include the methods of field oxide programming, ion implant programming, and through-hole contact programming. Field oxide programming differentiates the threshold voltage by a difference between the thicknesses of the gate oxides of the first memory elements and the second memory elements. Ion implant programming differentiates the threshold voltage by varying the conductivity type of the implant doped into the channel. In a NAND ROM, the first memory element has the channel doped with the same conductivity implants as the source/drain, which make the memory element always "ON" irrespective of the corresponding word line signal. In through-hole contact programming, the contact holes for the interconnection of each cell are selectively formed according to the program.

Figure 4A:
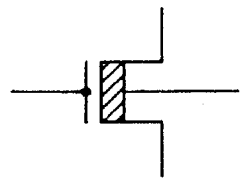
FIG. 4A and FIG. 4B show examples of the first memory element and the second memory element, respectively.
Figure 4B:
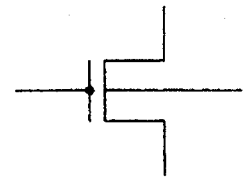

In ion implant programming of a NAND ROM, a depletion mode NMOS transistor (shown in FIG. 4A) may be formed as the first memory element and an enhancement mode NMOS transistor (shown in FIG. 4B) may be formed as the second memory element, where the depletion mode NMOS transistor is always "ON" irrespective of the corresponding word line and the enhancement mode NMOS is switched "OFF" when the corresponding word line signal is "low" level (the word line signal is low active) and "ON" when the corresponding word line signal is "high" level. If the enhancement mode NMOS transistor is "OFF", there is no current through the corresponding string which results in increasing the potential of the corresponding bit line substantially up to the "high" level. On the other hand, because the depletion mode NMOS transistor maintains an "ON" state independent from the corresponding word line signal, the current flows through the corresponding string to ground, which results in cutting down the potential of the corresponding bit line to ground (that is, "low" level).

Figure 2:
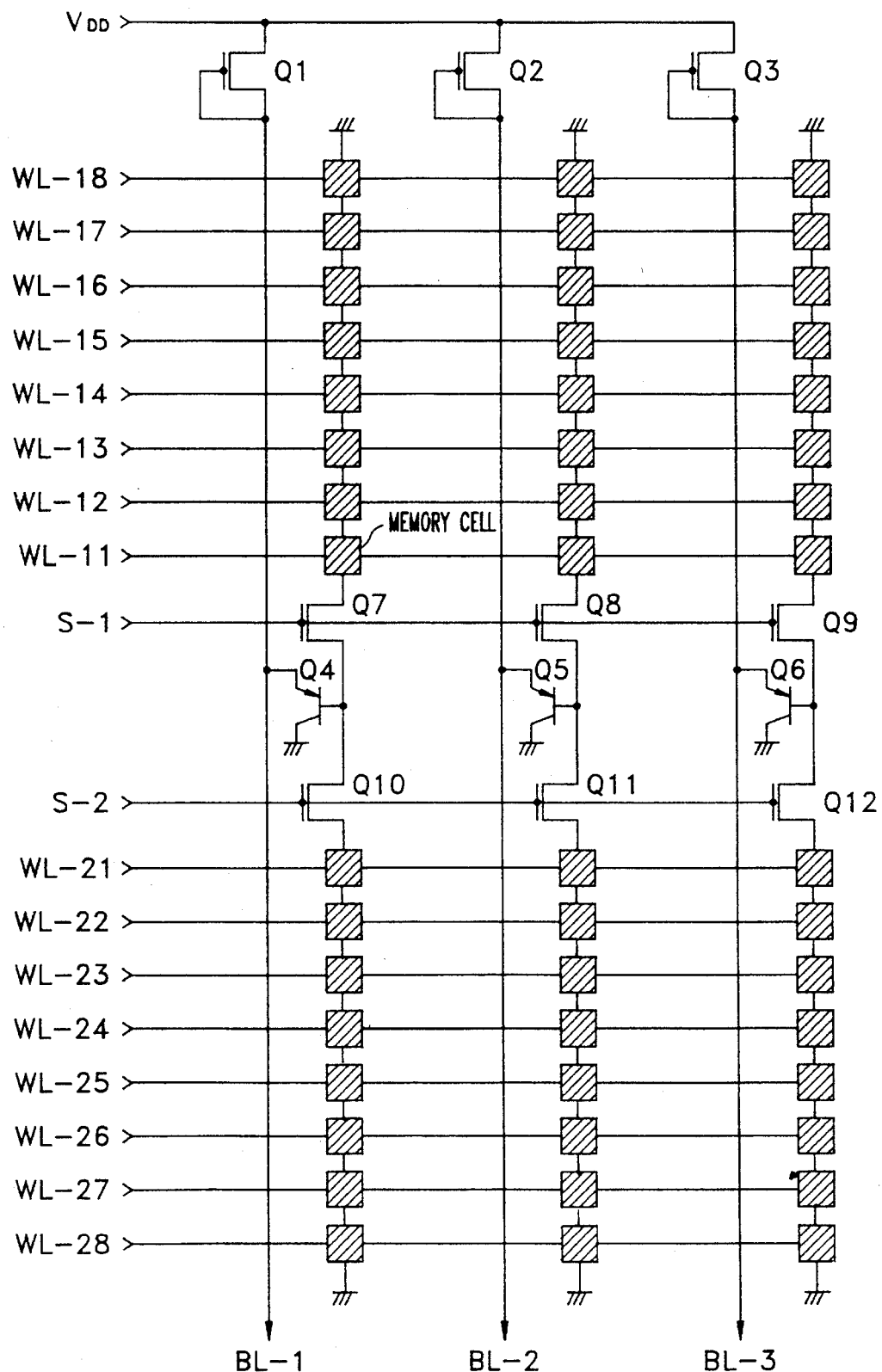
FIG. 2 illustrates another embodiment of a semiconductor ROM device according to the present invention.

FIG. 2 is a schematic circuit diagram of a semiconductor memory device according to another aspect of the present invention, which represents a portion of a cell array structure of a ROM which use both NAND logic circuitry and NOR logic circuitry.

In FIG. 2, each bit line (BL-1, BL-2, BL-3) is coupled to two strings. In the strings, selecting transistors Q7, Q8, Q9, Q10, Q11 and Q12 control access to the corresponding string. The gate of the selecting transistor is coupled to the corresponding string selecting line S-1 or S-2. Here, in order to select only one string of a plurality of strings coupled to one bit line, the signal of selecting line S-1 may have the opposite state to the signal of selecting line S-2. In other words, when the string selecting line S-1 is activated, the string constituted by the memory cells addressed by the word lines WL-11 through WL-18 is selected. On the other hand, when the string selecting line S-2 is activated, the string constituted by the memory cells addressed by the word lines WL-21 through WL-28 is selected.

The current driving transistors Q4, Q5 and Q6 each has a base coupled to the drains of the two adjacent selecting transistors, a collector coupled to ground and an emitter coupled to a corresponding bit line. The base of the current driving transistor and the drains of two adjacent selecting transistors are constituted by one region in common. This structure does not substantially increase the chip area required for implementation of the current driving transistors. In addition, differently from FIG. 2, a base of a current driving transistor can be coupled to at least 3 strings, in order to increase the integration density.

Figure 3:
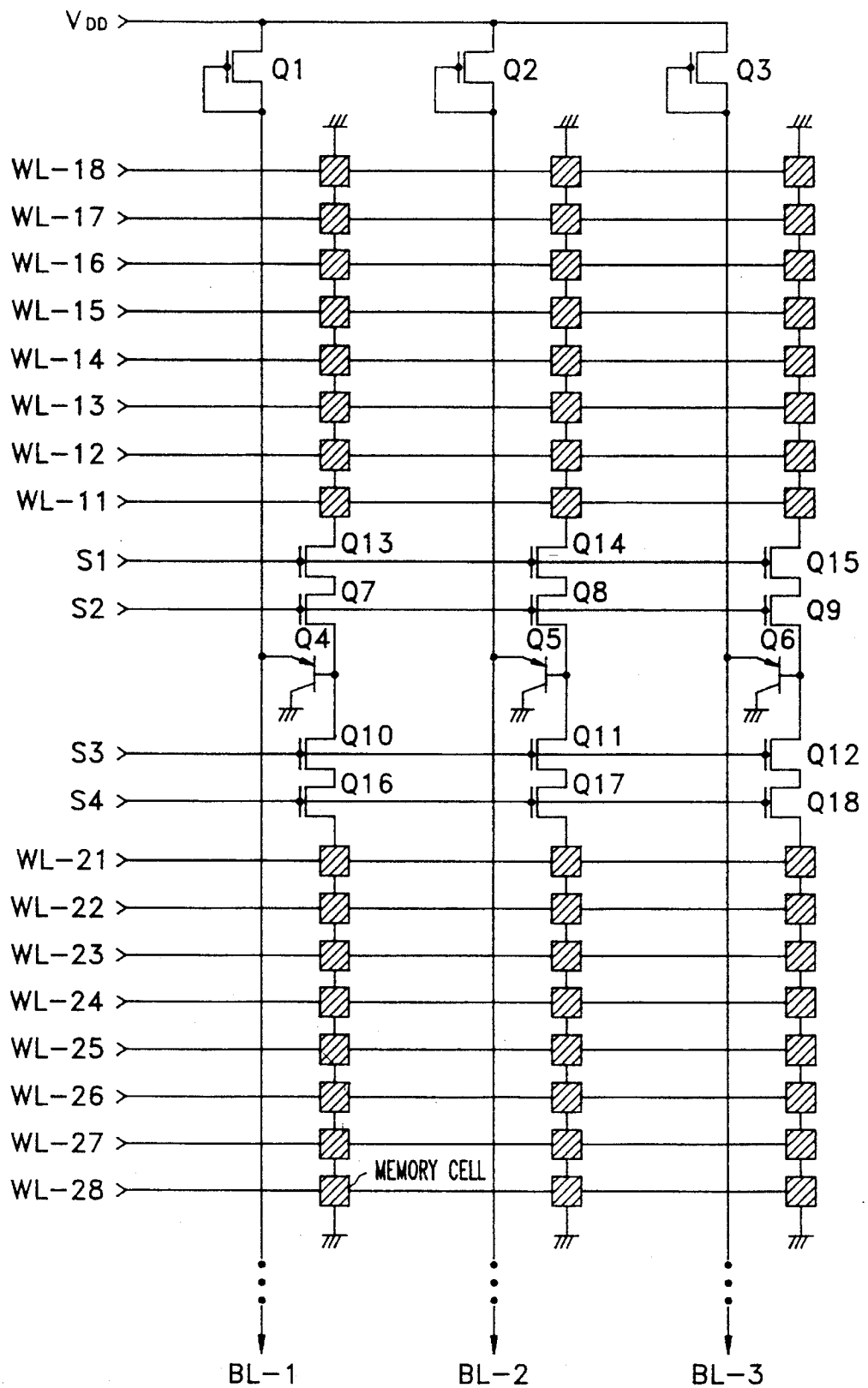
FIG. 3 illustrates still another embodiment of a semiconductor ROM device according to the present invention.

FIG. 3 is a schematic circuit diagram of a semiconductor ROM device according to still another aspect of the present invention.

In FIG. 3, respective bit lines BL-1, BL-2 and BL-3 are coupled to at least three strings, so that each string includes at least two selecting transistors. If selecting line S1 and S2 are applied with activate signals, selecting transistors Q13, Q14, Q15, Q7, Q8 and Q9 turn on, so the strings defined by WL-11 to WL-18 are selected. Meanwhile, if selecting lines S3 and S4 are applied with activate signals, selecting transistors Q10, Q11, Q12, Q16, Q17 and Q18 turn on, and thereby the strings defined by WL-21 to WL-28 are selected.

Figure 5:
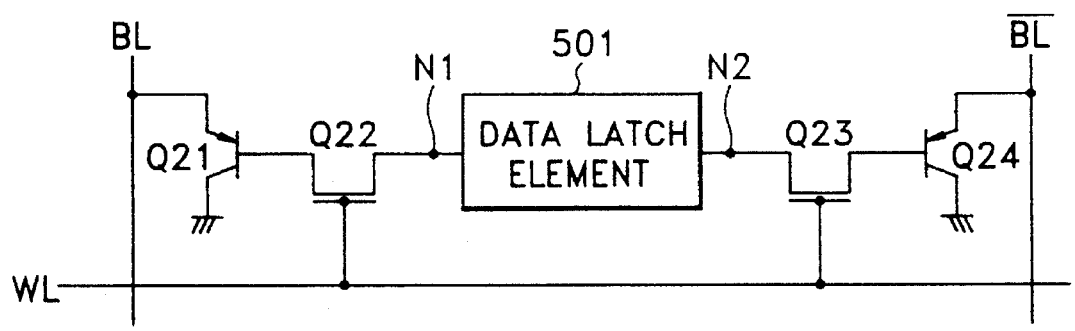
FIG. 5 illustrates one embodiment of a semiconductor SRAM device according to the teaching of the present invention.

FIG. 5 is a schematic circuit diagram of a semiconductor SRAM device according to still another aspect of the present invention. The semiconductor SRAM device includes a bit line BL, an inverse bit line /BL, a word line WL, two current driving transistors Q21 and Q24, two access transistors Q22 and Q23, and a data latch element 501.

In current driving transistor Q21, the emitter is coupled to bit line BL, the collector is coupled to ground and the base is coupled to the drain of access transistor Q22. Similarly, the emitter of current driving transistor Q24 is coupled to inverse bit line /BL, the collector thereof is coupled to ground, and the base thereof is coupled to the drain of access transistor Q23. The gates of access transistors Q22 and Q23 are coupled to word line WL, the source of access transistor Q22 is coupled to a node N1 and the source of access transistor Q23 is coupled to a node N2. Data latch element 501 stores data as the potential differential between node N1 and node N2.

In this SRAM memory cell, the current flowing through the bit line is increased, so that the operation speed is increased. Current driving transistors Q21 and Q24 are preferably constituted by vertical bipolar transistors.

Figure 6:
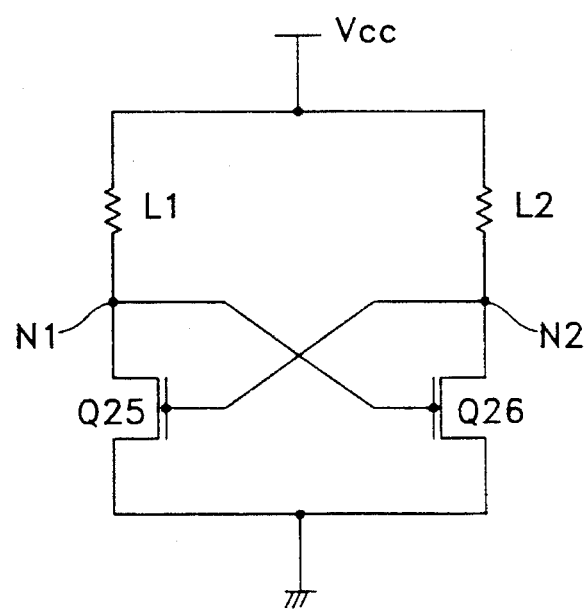
FIG. 6 shows one example of the data latch element shown in FIG. 5.

FIG. 6 shows one example of the data latch element shown in FIG. 5. The data latch element includes two loads L1 and L2 and two pull-down transistors Q25 and Q26. Load L1 is coupled between power supply node $V_{CC}$ and node N1, and load L2 is coupled between power supply node $V_{CC}$ and node N2. The drain and source of transistor Q25 are coupled to node N1 and ground, respectively, and the gate of transistor Q25 is coupled to node N2. Correspondingly, the drain and source of transistor Q26 are coupled to node N2 and ground, respectively, and the gate of transistor Q26 is coupled to node N1. This structure has two stable states, where node N1 is at a "high" level and node N2 is at a "low" level in one state, and node N1 is at a "low" level and node N2 is at a "high" level in the other state.

Figure 7:
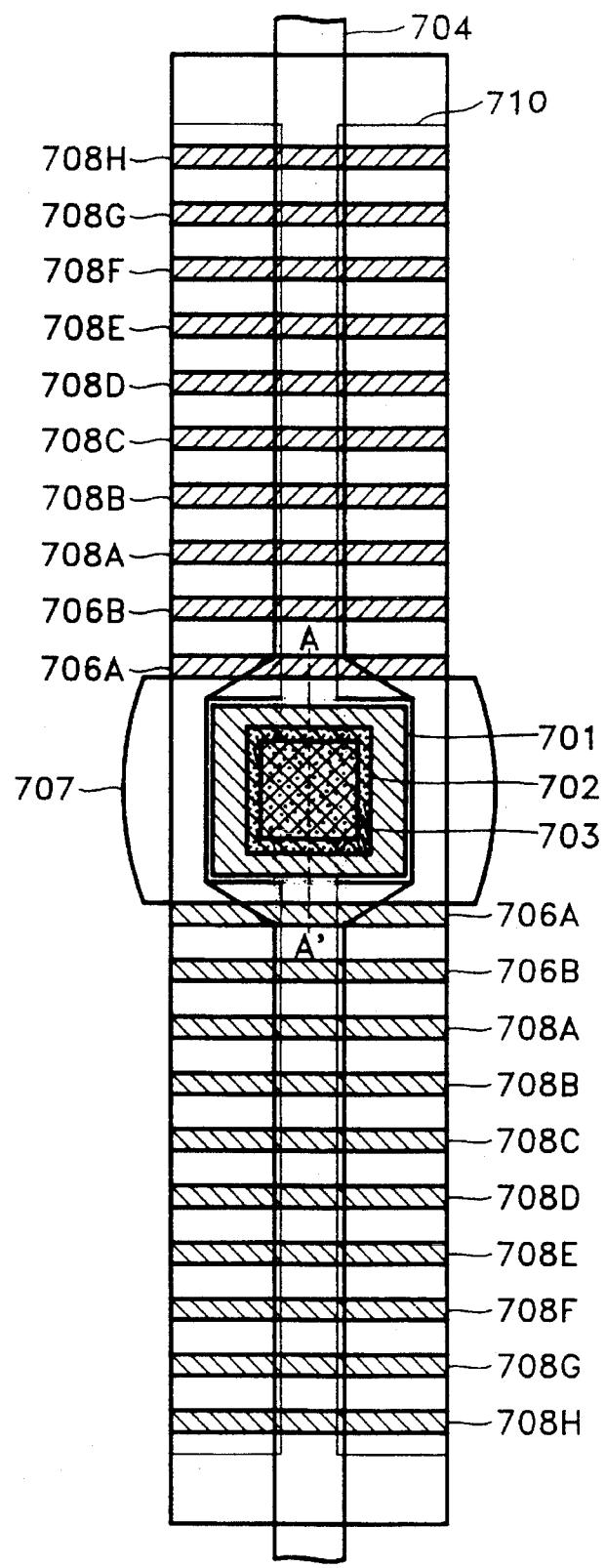
FIG. 7 is a plan view illustrating one example of a semiconductor structure which corresponds to a portion of the semiconductor ROM device shown in FIG. 3.

FIG. 7 is a plan view illustrating one example of a semiconductor structure which corresponds to a portion of the semiconductor ROM device shown in FIG. 3.

In FIG. 7, reference numerals 706A and 706B designate the string selecting lines each serving as the gate of a respective string selecting transistor. Reference numerals 708A to 708H designate the word lines, where each memory element is composed of one selected between an enhancement mode MOS transistor and a depletion mode MOS transistor. In addition, the respective word lines serve as the gates of the corresponding MOS transistors employed as memory elements. Reference numeral 701 designates the emitter region of the current driving transistor which is composed of a polysilicon layer with p-type impurities. Reference numeral 702 designates the base of the current driving transistor and reference numeral 703 designates the contact hole for interconnections between the base and the emitter and between the emitter and the bit line. Reference numeral 704 designates the bit line and reference numeral 710 designates an active area where doping regions such as sources and drains of transistors and channels are formed. Reference numeral 707 designates the prevention mask used during ion implantation for source/drain region formation.

Figure 8:
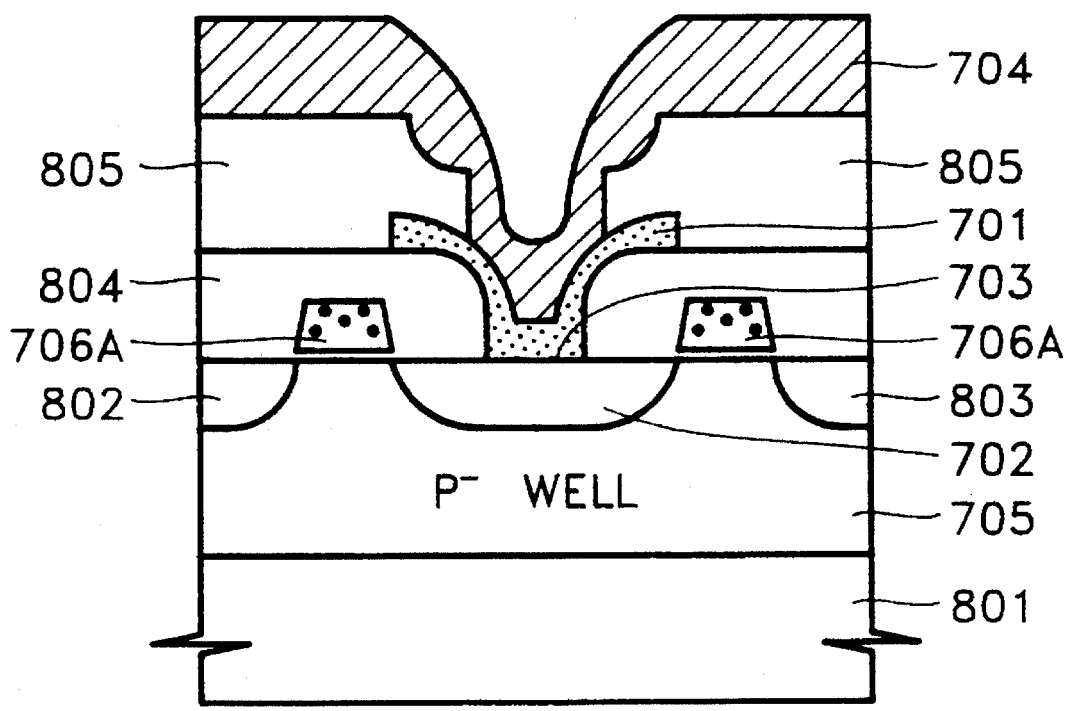
FIG. 8 is a cross-sectional view taken along line AA' in FIG. 7.

FIG. 8 is a cross-sectional view taken along line AA' in FIG. 7.

In FIG. 8, a p-type well 705 which serves as the collector of the current driving transistor is formed on a semiconductor substrate 801 and is coupled to ground by a separate contact hole (not shown in FIG. 8). Alternatively, p-type well 705 may be coupled to a potential node lower than ground, in order to improve the discharging capability of a bit line. Doping region 702 serves as both the base of the current driving transistor and the common drain of two adjacent string selecting transistors. Reference numerals 802 and 803 designate the source regions of two adjacent string selecting transistors. A semiconductor layer 701 is formed between an insulating layer 804 and an insulating layer 805, and serves as the emitter of the current driving transistor. Semiconductor layer 701 is coupled to the doping region 702 through a contact hole formed in insulating layer 804 and is coupled to a corresponding bit line 704 through a contact hole formed in insulating layer 805.

FIG. 9A to FIG. 9G are cross-sectional views illustrating the fabrication of the current driving transistor and the adjacent structure thereof shown in FIG. 7, according to the present invention.

Figure 9A:
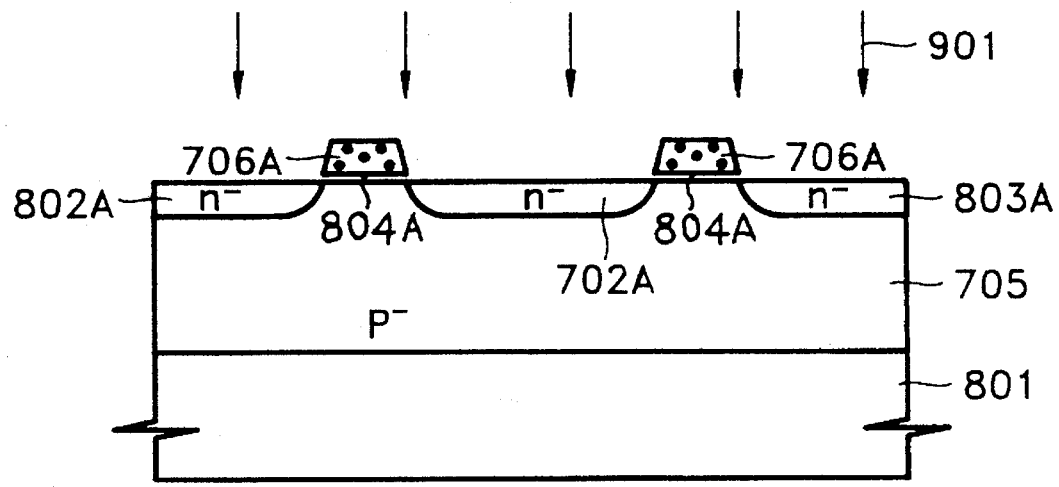
FIG. 9A to FIG. 9G are cross-sectional views illustrating the fabrication of the current driving transistor structure and the adjacent structure thereof shown in FIG. 7, according to the present invention.

Referring to FIG. 9A, a p-type well 705 is formed on a semiconductor substrate 801 and then a gate insulating film 804A and polysilicon gates 706A are formed on p-type well 705. Here, polysilicon gates 706A serve as the respective string selecting lines. In addition, word lines 708A–708H (not shown in FIGS. 9A–9G) are formed by the same process as the polysilicon gates 706A. N-type impurities (901) such as phosphorus are implanted in a concentration of $3.2 \times 10^{13}$ dopants/cm$^2$ with 60 KeV energy, to form n-doping regions 802A, 702A and 803A. Doping region 802A defines the source of one selecting transistor, doping region 803A defines the source of another selecting transistor, and doping region 702A defines the common drain of two adjacent selecting transistors and the base of the current driving transistor.

Figure 9B:
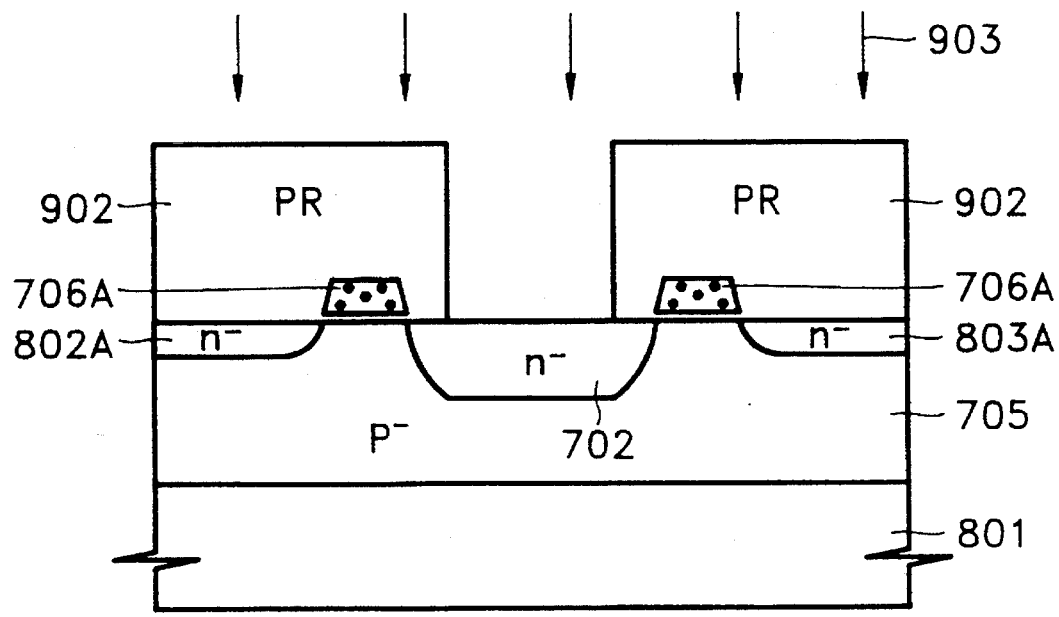

Subsequently, as shown in FIG. 9B, a photoresist mask pattern 902 exposing a portion of doping region 702A is formed by a photolithography process and then n-type impurities (903) such as phosphorous are implanted in a concentration of $2 \times 10^{13}$–$6 \times 10^{13}$ dopants/cm$^2$ with an energy of 100–180 KeV, so as to form n- doping region 702. Here, the distance between doping region 702 and polysilicon gates 706A and the depth of doping region 702 are controlled in order to prevent both a short between doping regions 802A, 803A and doping region 702 and punch-through.

Figure 9C:
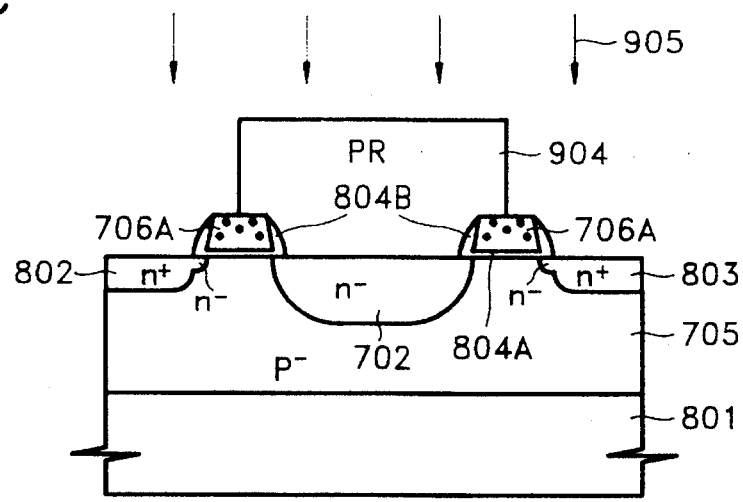
Figure 9D:
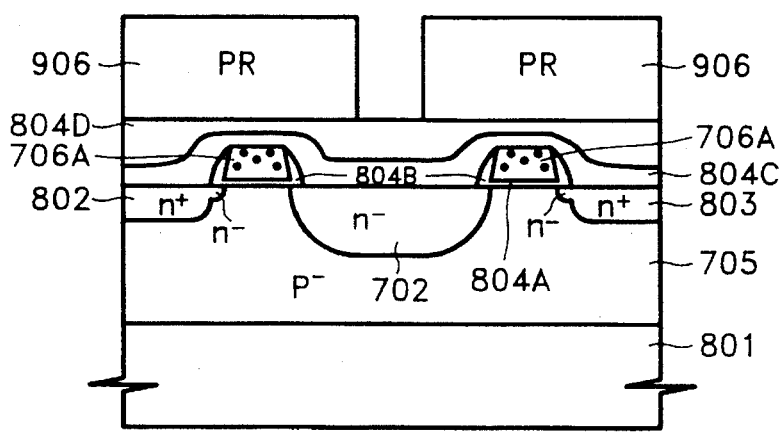

Referring to FIG. 9C, spacers 804B are formed on the sides of respective polysilicon gates 706A. A photoresist mask pattern 904 exposing the source regions 802A and 803A is formed, and then ion implantation (905) is performed, where n-type impurities such as arsenic(As) are doped in a concentration of $5 \times 10^{15}$ dopants/cm$^2$ with an energy of 40 KeV, so as to form an LDD structure of source regions 802 and 803 of the respective selecting transistors.

Figure 9E:
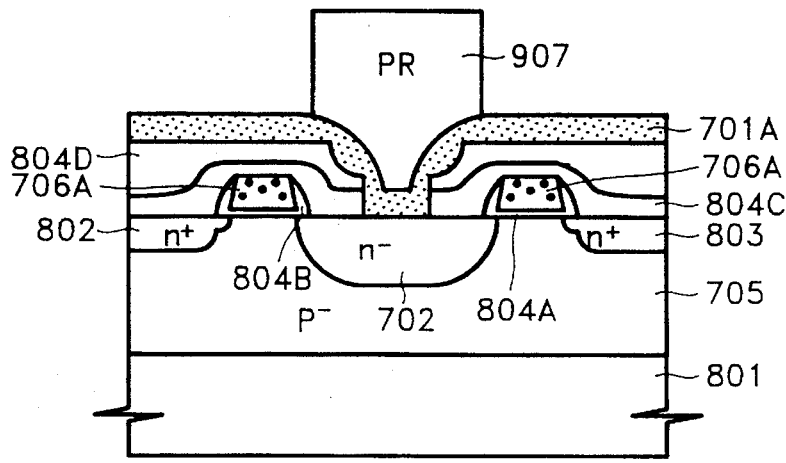

After removing the mask 904, an HTO (High Temperature Oxide) layer 804C and an BPSG (Boronphosphorous Silicate Glass) layer 804D are sequentially formed as an interlayer insulating layer. Next, on the surface of BPSG layer 804D, a photoresist mask pattern 906 defining a contact hole is formed, and then insulating layers 804D and 804C are selectively etched so as to form the contact hole. Subsequently, as shown in FIG. 9E, photoresist mask pattern 906 is removed and a p+ polysilicon layer 701A is formed in the thickness of 500 Å–1500 Å, being connected to doping region 702 through the contact hole formed in interlayer insulating layer 804C and 804D. Here, the formation of p+ polysilicon layer 701A is performed by an in-situ depositing process, or by doping of Boron (B) after depositing an undoped polysilicon layer. Then, using a photoresist mask pattern 907 defining the emitter of the current driving transistor, p+ semiconductor layer 701A is selectively etched.

Figure 9F:
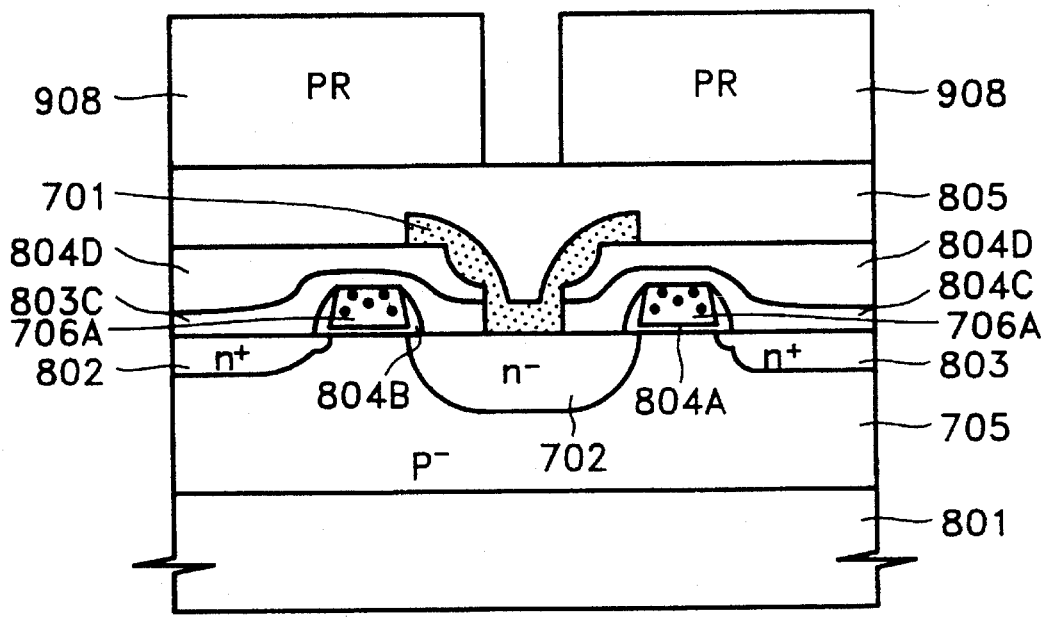
Figure 9G:
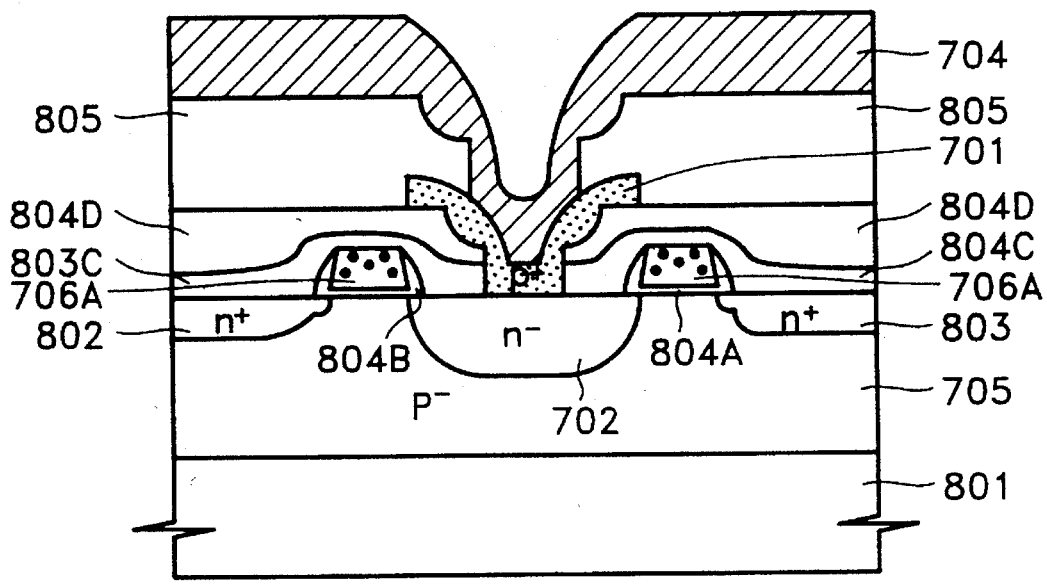

Referring to FIG. 9F, on the surfaces of BPSG interlayer insulating layer 804D and patterned p+ polysilicon layer 701, an HTO/BPSG layer 805 is deposited as an interlayer insulating layer, and then a reflow process is performed so as to planerize the surface of HTO/BPSG layer 805.

Next, a photoresist mask pattern 908 defining a contact hole for exposing the p+ polysilicon emitter layer 701 is formed by a photolithography process and then the HTO/BPSG interlayer insulating layer 805 is selectively etched so as to form the contact hole. Then, in FIG. 9G, a bit line 704 composed of a metal such as aluminum is formed on the resultant structure, so that the bit line 704 is coupled to p+ polysilicon emitter layer 701.

Figure 10:
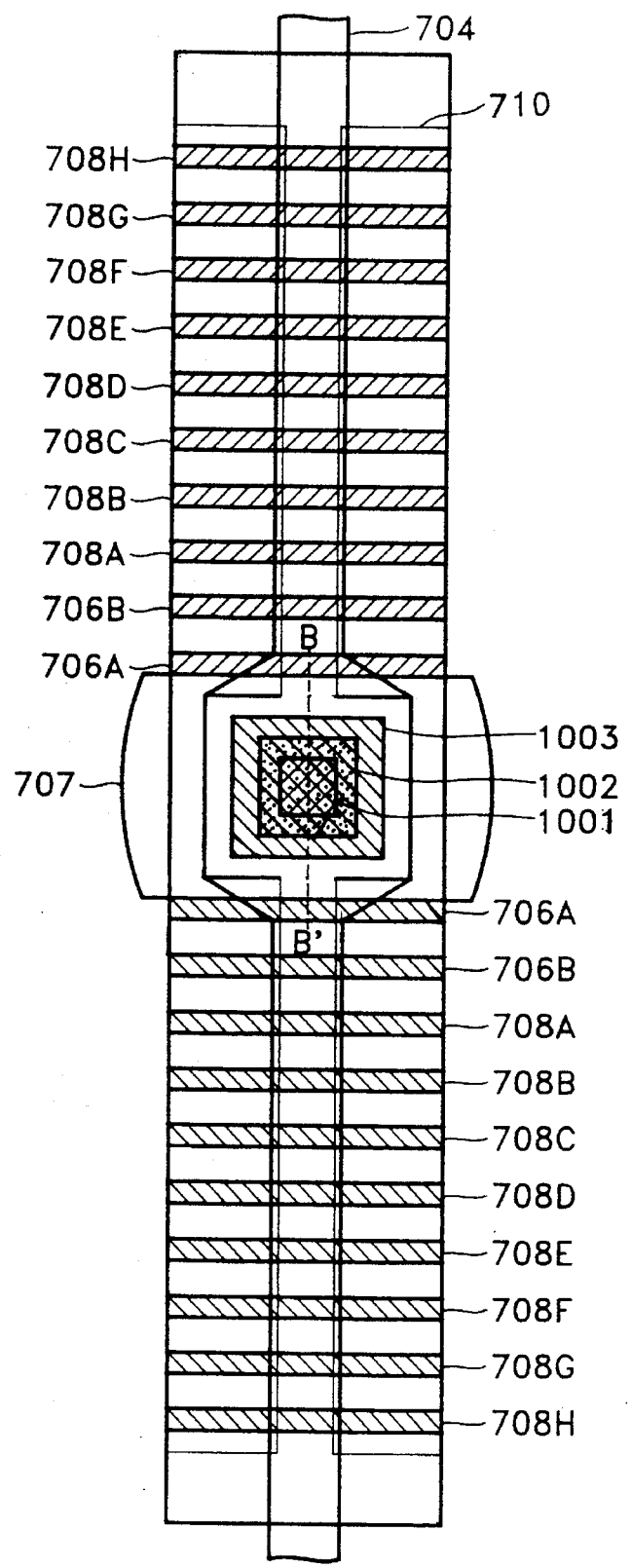
FIG. 10 is a plan view illustrating another example of a semiconductor structure which corresponds to a portion of the semiconductor ROM device shown in FIG. 3.

FIG. 10 is a plan view illustrating another example of a semiconductor structure which corresponds to a portion of the semiconductor ROM device shown in FIG. 3.

In FIG. 10, reference numerals 706A and 706B designate the string selecting lines and reference numerals 708A–708H designate the word lines. Reference numeral 1002 designates the emitter region of the current driving transistor and reference numeral 1003 designates the base of the current driving transistor. Reference numeral 1001 designates the contact hole for interconnections between the emitter of the current driving transistor and the bit line. Reference numeral 704 designates the bit line and reference numeral 710 designates an active area where n+ sources/drains and channels are formed. Reference numeral 707 designates the prevention mask used during ion implantation for source/drain region formation.

Figure 11:
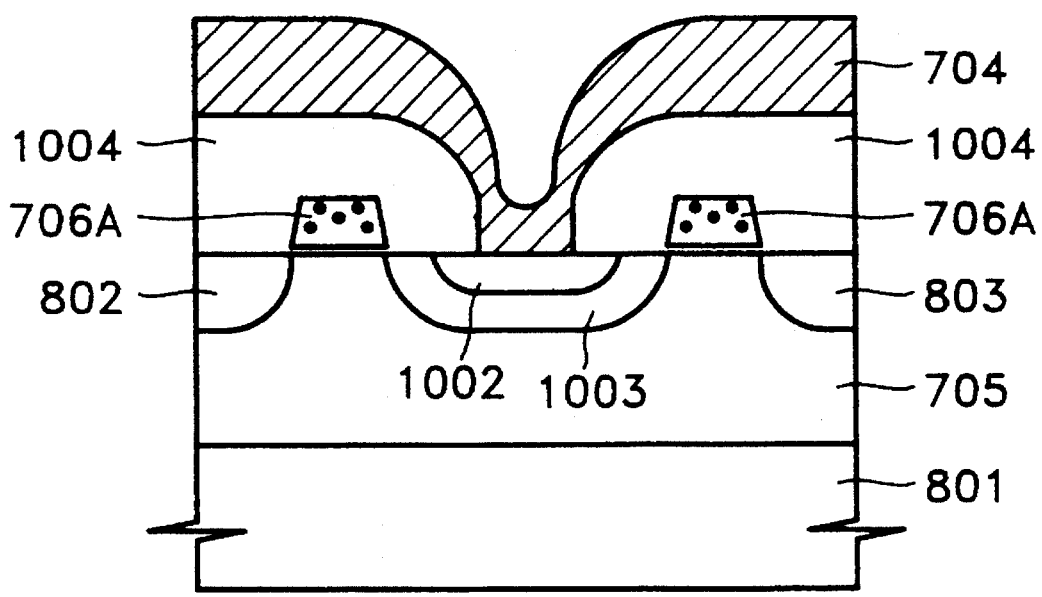
FIG. 11 is a cross-sectional view taken along line BB' in FIG. 7.

FIG. 11 is a cross-sectional view taken along line BB' in FIG. 7.

In FIG. 11, doping region 1003 serves as both the common drain of two adjacent selecting transistors and the base of the current driving transistor. Doping region 1002 serves as the emitter of the current driving transistor, being coupled to the corresponding bit line 704 through a contact hole formed in the insulating layer 1004.

FIG. 12A to FIG. 12F are cross-sectional views illustrating the fabrication of the current driving transistor structure and the adjacent structure shown in FIG. 11, according to the present invention.

Figure 12A:
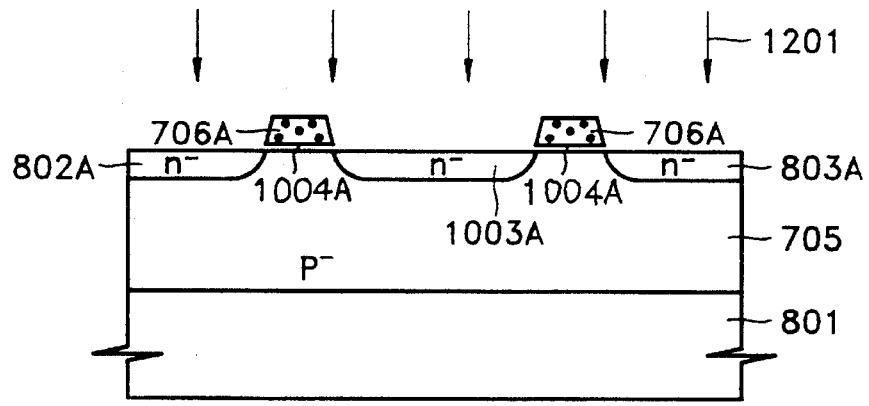
FIG. 12A to FIG. 12F are cross-sectional views illustrating the fabrication of the current driving transistor structure and the adjacent structure shown in FIG. 10, according to the present invention.

Referring to FIG. 12A, a p-type well 705 which serves as the collector of the current driving transistor is formed on a semiconductor substrate 801 and then a gate insulating film 1004A and polysilicon gates 706A are formed on p-type well 705. N-type impurities (1201) are implanted so as to form n-doping regions 802A, 1003A and 803A.

Figure 12B:
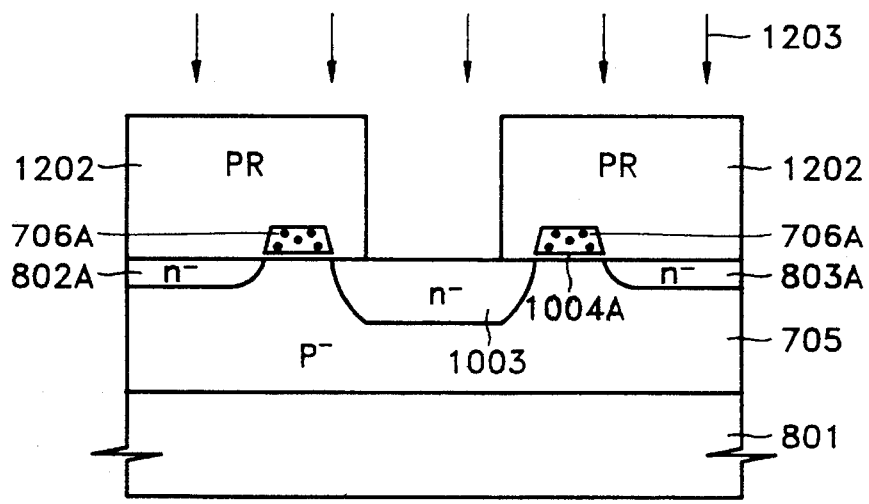

Next, as shown in FIG. 12B, a photoresist mask pattern 1202 exposing a portion of doping region 1003A is formed by a photolithography process and then n-type impurities (1203) such as phosphorous are implanted in a concentration of $2 \times 10^{13} \sim 6 \times 10^{13}$ dopants/cm$^2$ with an energy of 130~180 KeV, so as to form n- doping region 1003.

Figure 12C:
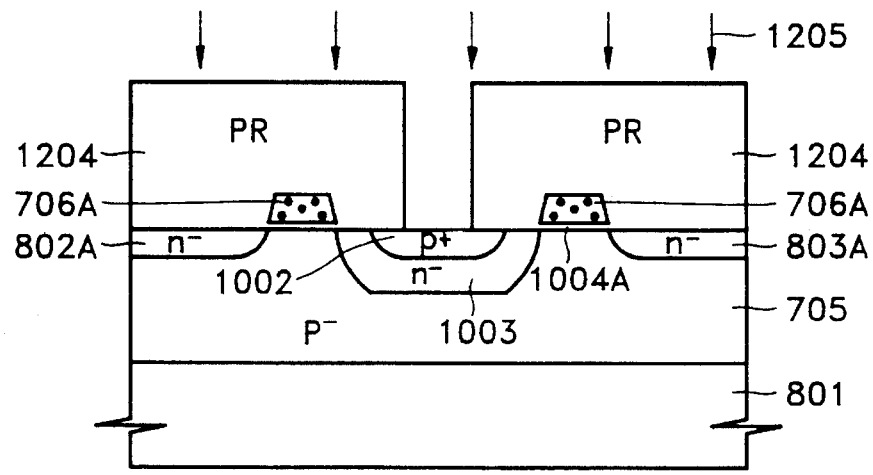

After removing the mask pattern 1202, as shown in FIG. 12C, a photoresist mask pattern 1204 defining the emitter of the current driving transistor is formed, and then ion implantation (1205) for formation of the emitter is performed whereby p-type impurities such as BF$_2$ are implanted in a concentration of $2 \times 10^{15} \sim 4 \times 10^{15}$ dopants/cm$^2$ with an energy of 40~80 KeV.

Figure 12D:
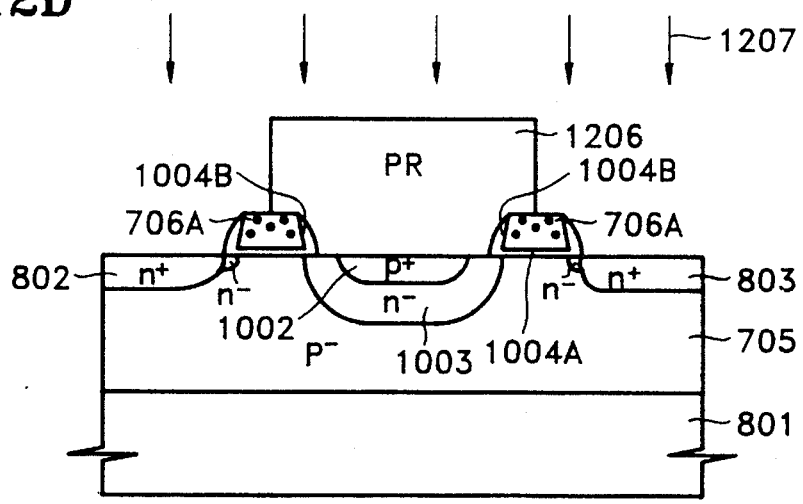

Next, mask pattern 1204 is removed, and then as shown in FIG. 12D, spacers 1004B are formed on the sides of the respective polysilicon gates 706A. A photoresist mask pattern 1206 exposing the source regions 802A and 803A of two adjacent string selecting transistors is formed, and then ion implantation is performed, where n-type impurities (1207) such as arsenic (As) are doped in a concentration of $5 \times 10^{15}$ dopants/cm$^2$ with an energy of 40 KeV, so as to form an LDD structure of source regions 802 and 803 of the respective selecting transistors.

Figure 12E:
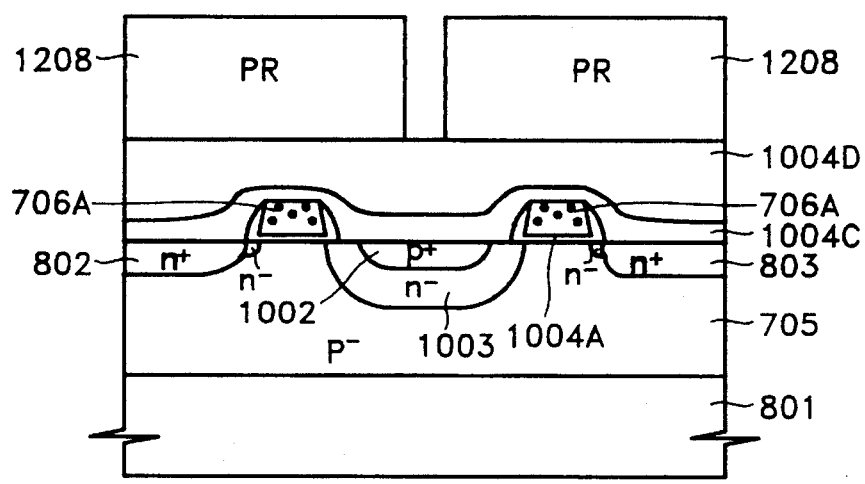
Figure 12F:
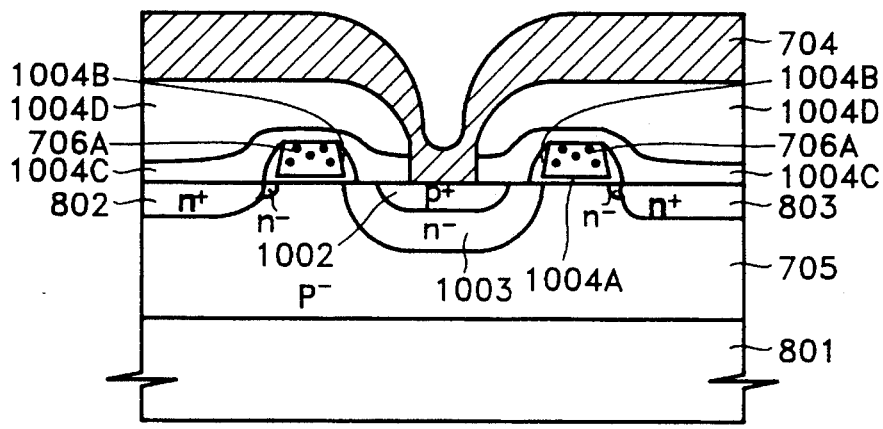

After removing the mask pattern 1206, an HTO (High Temperature Oxide) layer 1004C and a BPSG (Boronphosphorous Silicate Glass) layer 1004D are sequentially formed as an interlayer insulating layer (in FIG. 12E). Next, on the surface of BPSG layer 1004D, a photoresist mask pattern 1208 defining a contact hole is formed, and then insulating layers 1004D and 1004C are selectively etched so as to form the contact hole. Subsequently, as shown in FIG. 12F, photoresist mask pattern 1208 is removed and then a bit line 704 composed of metal such as aluminum is formed on the resultant structure, where the bit line 704 is coupled to emitter region 1002.

The semiconductor memory device including the current driving transistor according to the present invention has the effect that the current of the respective bit lines is increased, which results in increasing the operation speed, so as to increase the integration density of memory elements. Therefore, the cost thereof is reduced.

While the invention has been described in conjunction with a few specific embodiments, it will be evident to those skilled in the art that many alternatives, modifications and variations may be made in light of the foregoing description. Accordingly, the present invention is intended to embrace all such alternative modifications and variations as fall within the spirit and scope of the appended claims.

What is claimed is:

1. A read-only memory device comprising:

a plurality of word lines;

a plurality of bit lines;

a plurality of current driving transistors each having an emitter, a collector and a base, the emitter of each said current driving transistor coupled to a respective different bit line, and the collector of each said current driving transistor coupled to ground; and a plurality of NAND type strings, each string composed of string selecting transistors coupled to the base of a different one of said current driving transistors and ground.

2. A read-only memory device according to claim 1, wherein each of said memory elements includes one of a first memory element having a depletion mode MOS transistor connected at a gate to an associated word line and a second memory element having an enhancement mode MOS transistor connected at a gate to an associated word line.

3. A read-only memory device according to claim 1, further comprising:

a string selecting line through which a string selecting signal is transferred; and a plurality of string selecting transistors coupled in series between the base of a corresponding current driving transistor and one end of a corresponding string and having the gate coupled to said string selecting line.

4. A read-only memory device comprising:

a plurality of word lines;

a plurality of bit lines;

a plurality of strings each composed of multiple memory elements coupled in series and each string having one end coupled to ground and another end, wherein each memory element is a read-only memory element;

a plurality of string selecting lines for receiving a corresponding string selecting signal;

a plurality of string selecting transistors each having a source, a drain and a gate, with the source of each string selecting transistor being coupled to said another end of a corresponding one of said strings and said gate of each string selecting transistor being coupled to a corresponding one of said plurality of string selecting lines; and a plurality of current driving transistors each having a base coupled to the drains of two adjacent string selecting transistors, and an emitter coupled to a corresponding bit line.

5. A read-only memory device according to claim 4, wherein each of said memory elements includes one of a first memory element having a depletion mode MOS transistor connected at its gate to an associated word line and a second memory element having an enhancement mode MOS transistor connected at its gate to an associated word line.

6. A semiconductor SRAM cell circuit comprising:

a bit line;

an inverse bit line;

a word line;

a first current driving transistor having a first emitter, a first collector and a first base, said first emitter being coupled to said bit line, and said first collector being coupled to ground;

a second current driving transistor having a second emitter, a second collector and a second base, said second emitter being coupled to said inverse bit line, and said second collector being coupled to ground;

a data latch element having a first node and a second node, for storing a data bit as a potential difference between said first node and said second node;

a first access transistor coupled between said first base of said first current driving transistor and said first node of said data latch element, said first access transistor being switched between conducting and non-conducting states in accordance with a signal on said word line; and a second access transistor coupled between said second base of said second current driving transistor and said second node of said data latch element, and being switched between conducting and non-conducting states in accordance with said signal on said word line.

7. A read-only memory structure comprising:

a semiconductor substrate;

a plurality of word lines formed over said semiconductor substrate with a first insulating layer disposed therebetween;

a plurality of bit lines formed over said first insulating layer with a second insulating layer disposed therebetween;

a plurality of NAND type strings, each composed of multiple memory elements coupled in series and having one end coupled to ground, wherein each memory element is a read-only memory element;

a plurality of string selecting transistors, each having a source coupled to the other end of a corresponding string, a gate line for receiving a corresponding string selecting signal and a common drain region, wherein the common drain region serves as the drain of two adjacent string selecting transistors; and a plurality of current driving transistors, each having a collector composed of a well, a base constituted by said common drain region which is disposed over said well, and an emitter constituted by a semiconductor layer which is formed between said first insulating layer and said second insulating layer and coupled to said common drain region through a contact hole in said first insulating layer and coupled to a corresponding bit line through a contact hole in said second insulating layer.

8. A read-only memory structure according to claim 7, wherein said common drain region is doped with N-type impurities in a concentration of $10^{17} \sim 10^{19}$ dopants/cm$^2$.

9. A read-only memory structure according to claim 7, wherein said semiconductor layer is a polysilicon layer having a thickness of 500 Å~1500 Å.

10. A read-only memory structure according to claim 7, wherein said well is doped with $10^{14} \sim 10^{16}$ dopants/cm$^2$ concentration of impurities.

11. A read-only memory structure comprising:

a semiconductor substrate;

a plurality of word lines formed over said semiconductor substrate with a first insulating layer disposed therebetween;

a plurality of bit lines formed over said semiconductor substrate with a second insulating layer disposed therebetween;

a plurality of NAND type strings, each string being composed of multiple memory elements and having one end coupled to ground, where each memory element is a read-only memory element;

a plurality of string selecting transistors, each having a source coupled to the other end of a corresponding string, a gate line for receiving a corresponding string selecting signal and a common drain region, wherein said common drain region serves as a drain of each of two adjacent string selecting transistors; and a plurality of current driving transistors, each having a collector composed of a well, a base constituted by said common drain region which is disposed over said well, and an emitter constituted by a doping region formed in said common drain region and coupled to a corresponding bit line through a contact hole in said second insulating layer.

12. A read-only memory structure according to claim 11, wherein said common drain region is doped with N-type impurities in a concentration of $10^{17} \sim 10^{19}$ dopants/cm$^2$ and has a depth of 0.1 μm~0.5 μm.

13. A read-only memory structure according to claim 11, wherein said well is doped with impurities in a concentration of $10^{14} \sim 10^{16}$ dopants/cm$^2$.

* * * * *